United States Patent
Feist et al.

(10) Patent No.: US 7,820,921 B2
(45) Date of Patent: Oct. 26, 2010

(54) HOUSING FOR ACCOMMODATING AN ELECTRONIC COMPONENT AND ELECTRONIC COMPONENT ARRANGEMENT

(75) Inventors: Guenter Feist, Gingen/Fils (DE); Juergen Frey, Heidenheim (DE); Herbert Baschke, Syrgenstein (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/345,910

(22) Filed: Dec. 30, 2008

(65) Prior Publication Data

US 2009/0152003 A1    Jun. 18, 2009

Related U.S. Application Data

(63) Continuation of application No. PCT/DE2007/001034, filed on Jun. 12, 2007.

(30) Foreign Application Priority Data

Jun. 30, 2006  (DE)  ........................ 10 2006 030 248

(51) Int. Cl.
*H01R 13/502*  (2006.01)
(52) U.S. Cl. ...................... 174/560; 174/565; 174/549; 336/92
(58) Field of Classification Search ................. 174/520, 174/559, 560, 565, 549; 336/90, 92
See application file for complete search history.

(56) References Cited

U.S. PATENT DOCUMENTS

| 5,679,976 A | 10/1997 | Nishikawa et al. |
| 5,805,431 A * | 9/1998 | Joshi et al. ................. 361/836 |
| 5,932,324 A | 8/1999 | Pfeiffer |
| 2002/0130033 A1* | 9/2002 | Beitinger et al. ....... 204/192.14 |
| 2004/0051618 A1 | 3/2004 | Lindsey |

FOREIGN PATENT DOCUMENTS

| DE | PAN S 32092 VIII | 2/1953 |
| DE | 6948181 | 9/1970 |
| DE | 32 38 557 A1 | 4/1984 |
| DE | 37 26 744 C2 | 2/1988 |
| DE | 40 08 077 C2 | 9/1991 |
| DE | 38 72 505 T2 | 12/1992 |
| DE | 44 27 983 A1 | 2/1996 |
| DE | 198 15 852 A1 | 10/1999 |
| DE | 198 22 095 A1 | 12/1999 |
| DE | 101 24 117 A1 | 12/2002 |
| EP | 0 323 685 B1 | 1/1992 |
| GB | 2 193847 A | 2/1988 |

* cited by examiner

*Primary Examiner*—Hung V Ngo
(74) *Attorney, Agent, or Firm*—Slater & Matsil, L.L.P.

(57) ABSTRACT

A housing can accommodate an electronic component. An outer wall of the housing forms a flat contact wall in which contact areas for connecting the housing to an interconnect device are arranged.

18 Claims, 1 Drawing Sheet

HOUSING FOR ACCOMMODATING AN ELECTRONIC COMPONENT AND ELECTRONIC COMPONENT ARRANGEMENT

This application is a continuation of co-pending International Application No. PCT/DE2007/001034, filed Jun. 12, 2007, which designated the United States and was not published in English, and which claims priority to German Application No. 10 2006 030 248.6 filed Jun. 30, 2006, both of which applications are incorporated herein by reference.

TECHNICAL FIELD

The invention pertains to a housing for accommodating an electronic component and to an electronic component arrangement with a housing and an electronic component arranged therein.

BACKGROUND

German patent publication DE 198 15 852 A1 discloses a support for electronic components that consists of a ceramic material and features at least two mutually insulated contact areas, wherein the contact areas are arranged on a common plane of the support. Other metalized regions are arranged on at least one surface of the support that does not extend parallel to the common plane of the contact areas, wherein one metalized region is respectively connected to one of the contact areas in a conductive fashion.

German patent publication DE 32 38 557 A1 discloses a semiconductor component with a plastic encapsulation. The connecting contacts either consist of flat metal foils or of ductile metal foils shaped into cups that are in direct contact with the plastic.

SUMMARY

In one aspect, the invention discloses a housing for accommodating an electronic component that requires less material and less space, wherein the housing can also be easily connected to an interconnect device and inexpensively manufactured.

According to a first aspect of the invention, a housing accommodates an electronic component. An outer wall of the housing forms a flat contact wall in which the contact areas for connecting the housing to an interconnect device are arranged. The housing features several housing parts that are mechanically coupled to one another.

This is particularly advantageous because an adequate coplanarity between the housing and the interconnect device can be achieved in this fashion. Consequently, electronic components that have tolerances with respect to their geometry can be arranged on the interconnect device with great localized precision. This furthermore makes it possible to realize a housing that is composed of different housing parts with different physical and/or chemical properties.

It is particularly preferred that the housing feature coupling regions for coupling the electronic component to the housing, wherein the coupling regions are electrically connected to the contact areas. This makes it possible to safely arrange electronic components of any type on a flat interconnect device.

According to one particularly preferred embodiment, first housing parts feature a material of a first plastic and second housing parts feature a material of a second, different plastic. Consequently, the housing can be realized in an electrically insulating fashion.

It is particularly preferred to select the first and/or second plastic from the group of liquid crystalline polymers. This makes it possible to utilize the housing in a soldering bath because liquid crystalline polymers can also have a high stability and a high modulus of elasticity at typical soldering bath temperatures in excess of 200° C.

According to another particularly preferred embodiment, the first plastic is doped with palladium. Palladium-doped plastics are very well suited for the application of metal films.

According to another particularly preferred embodiment of the invention, the contact areas feature a layer of an electrically conductive material that is mechanically coupled to one of the first housing parts. This makes it possible to apply a thin electrically conductive layer onto the first housing part that forms the mechanical support in order to realize parts of the housing in an electrically conductive fashion.

It is particularly preferred to produce the layer by means of electroplating. This method makes it possible to easily apply thin electrically conductive layers onto housing parts.

According to another particularly preferred embodiment, the housing is realized in a cuboid fashion. This allows a simple manufacture of the housing with flat outer surfaces.

According to another preferred embodiment, the housing features a recess that contains a closure element for closing off the recess and for producing a closed cavity in the housing. This is particularly advantageous because such a closed cavity can be designed for accommodating the electronic component.

According to another particularly preferred embodiment, the closure element couples the electronic component, which is normally arranged in the recess, to the housing in a mechanically rigid fashion.

It is particularly advantageous to manufacture the closure element by means of casting. Casting can represent a simple and fast method for realizing the closure element.

According to another advantageous embodiment, the housing features an opposing wall that lies opposite the contact wall and forms a closed, flat outer surface. This is particularly advantageous because the flat contact wall region and the opposing wall region can be easily realized for accommodating and being soldered to the electronic component arrangement that includes the housing and the electronic component.

It is particularly preferred that the housing feature side walls that are arranged between the contact wall and the opposing wall, wherein one of the side walls has an opening. The opening in one of the side walls makes it possible to easily position the electronic component in the opening.

According to a second aspect, the invention also includes an electronic component arrangement with a housing and an electronic component arranged therein.

It is particularly preferred that the electronic component include an inductive component. Inductive components can be connected particularly well to the interconnect device by means of a housing, with a flat contact plane, in which they are arranged.

BRIEF DESCRIPTION OF THE DRAWINGS

Advantageous embodiments of the invention are described in greater detail below with reference to the schematic drawings.

Elements with identical construction or function are identified by the same reference symbols in all figures.

Figure 1:
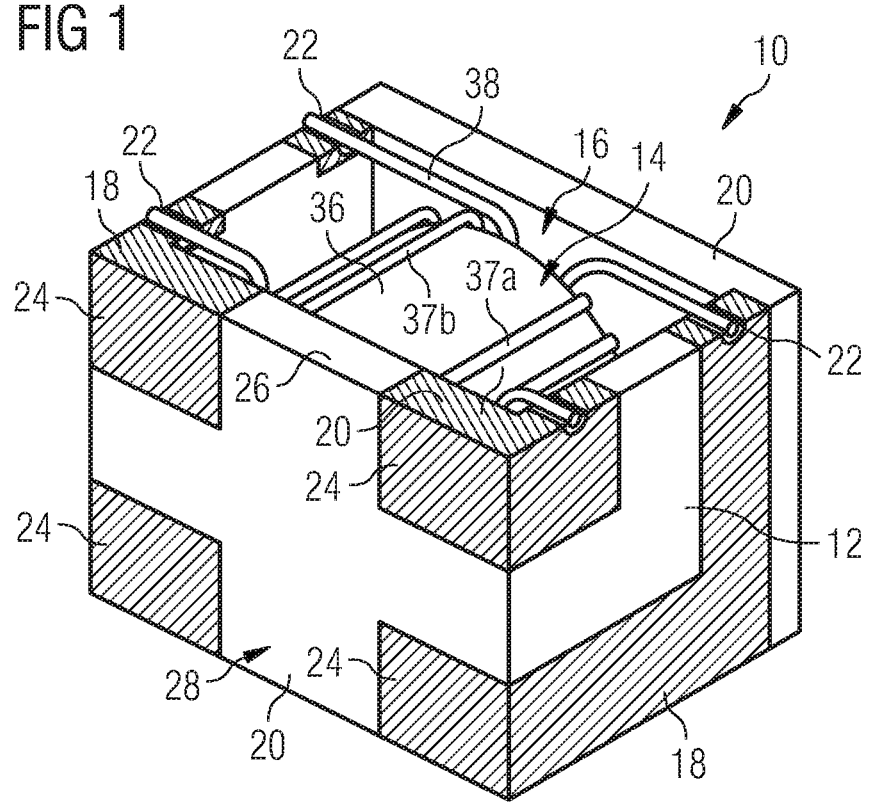
FIG. 1 is an oblique representation of an electronic component arrangement with a housing for accommodating an electronic component.

The following list of reference symbols can be used in conjunction with the drawings:

10 Electronic component arrangement
12 Housing
14 Electronic component
16 Recess
18 First housing part
20 Second housing part
21 Support section
22 Coupling region
24 Contact area
25 Layer of a conductive metal
26 Contact wall
28 Outer side
30 opposing wall
31 Outer surface of opposing wall
32 Side wall
33 Opening
34 Closure element
36 Coil core
37a, b Coils
38 Connecting leads
42 Interconnect device
44 Contact plane

DETAILED DESCRIPTION

FIG. 1 shows an electronic component arrangement 10 with a housing 12 and an electronic component 14 accommodated in the housing 12.

The housing 12 features a recess 16 in which the electronic component 14 is arranged. The housing 12 includes a first housing part 18 and a second housing part 20. The first housing part 18 and the second housing part 20 are realized in the form of an integral housing 12 with the aid of not-shown connecting elements. The connecting elements preferably comprise pins and corresponding holes that are respectively realized in and with the first housing part 18 and the second housing part 20.

The first housing part 18 preferably includes several parts. The first housing parts 18 respectively feature a support section 21 (labeled in FIG. 2) with coupling regions 22 and contact areas 24 arranged thereon, wherein the significance of these coupling regions and contact areas is discussed in detail below. The support sections 21 comprise a material of a first plastic and the second housing parts 20 feature a material of a second plastic. The first and/or the second plastic is/are preferably selected from the group of liquid crystalline polymers. One important property of liquid crystalline polymers is that they can also have a high stability and a high modulus of elasticity at customary soldering bath temperatures in excess of about 200° C.

The coupling regions 22 and the contact areas 24 of the first housing parts 18 are applied onto the support sections 21 in the form of films 25 (labeled in FIG. 2) of an electrically conductive material, preferably a metal. It is particularly preferred that the coupling regions 22 and the contact areas 24 feature materials from the group consisting of gold, copper and nickel. These materials have good conductivity, as well as good solderability.

In order to produce a good connection between the coupling regions 22 and the contact areas 24 on the one hand and the support sections 21 on the other hand, it is proposed that the first plastic, from which the support sections 21 are formed, be doped with palladium. The palladium doping of plastics makes it possible to adequately connect the coupling regions 22 and contact areas 24 including the layers 25 to the support sections 21.

According to FIG. 1, the contact areas 24 are arranged on a contact wall 26 of the cuboid housing 12. The contact wall 26 has an outer side 28, wherein the contact areas 24 that are electrically coupled to the coupling regions 22 are arranged in the outer side 28 of the contact wall 26.

Figure 2:
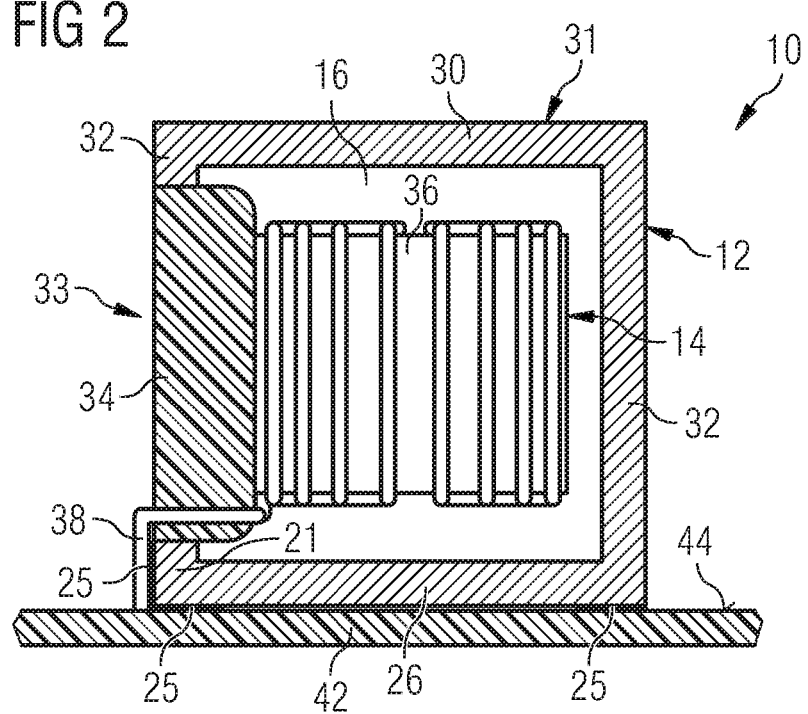
FIG. 2 is a sectional representation of the electronic component arrangement with the housing for accommodating the electronic component.

An opposing wall 30 (labeled in FIG. 2) is arranged opposite of the contact wall 26 in the housing 12 and forms a closed, flat outer surface 31 (labeled in FIG. 2).

The housing 12 also features side walls 32 that are arranged between the contact wall 26 and the opposing wall 30 that lies opposite from the contact wall 26. One of the side walls 32 features an opening 33 that makes it possible to position the electronic component 14 in the recess 16.

The electronic component 14 is realized in the form of an inductive component with two coils 37a, 37b that are arranged on a coil core 36 and together feature four connecting leads 38. However, it would also be possible to consider components with only two connecting leads, as well as components with more than four connecting leads such as, for example, transformers.

According to FIG. 2, a closure element 34 is arranged in the recess 16 such that the electronic component 14 is coupled to the housing 12 in a mechanically rigid fashion. It is particularly preferred to manufacture the closure element 34 by means of casting because this represents a particularly simple option for closing off the recess 16 of the housing 12.

FIG. 2 shows the electronic component arrangement 10, with the housing 12 in which the electronic component 14 is arranged, and an interconnect device 42.

The interconnect device 42 features a contact plane 44, wherein the contact wall 26 of the housing 12 is coupled to the contact plane 44 of the interconnect device 42 in a mechanically rigid fashion. A superior soldered or bonded connection between the housing 12 and the interconnect device 42 can be produced in this fashion. Since the contact wall 26 is designed in the form of a flat contact wall with flat contact areas 24, very good co-planarity values are achieved between the housing 12 and the interconnect device 42.

The method for manufacturing the electronic component arrangement 10 that includes the housing 12 and the electronic component 14, as well as the subsequent coupling between the electronic component arrangement 10 and the interconnect device 42, is briefly described below.

Initially, the electronic component 14 and the housing 12 are supplied. Subsequently, the electronic component 14 is positioned in the recess 16 of the housing 12 and the connecting leads 38 are electrically coupled to the coupling regions 22 of the housing 12. Finally the closure element 34 is introduced into the recess 16 of housing 12, wherein the closure element 34 is preferably positioned in the recess 16 of the housing 12 by means of casting.

After the manufacture of the electronic component arrangement 10, it can be attached to the interconnect device 42. For this purpose, the electronic component arrangement 10 is picked up at the planar outer surface 31 of the opposing wall 30 by means of a gripper that is known from the field of electrical engineering and preferably includes a suction device, placed onto the contact plane 44 of the interconnect device 42, and coupled to the contact plane 44 over its entire surface at this location, preferably by means of soldering or bonding.

What is claimed is:

1. A housing for accommodating an electronic component, the housing comprising:
    a plurality of housing parts that are mechanically coupled to one another;
    an outer wall of at least one of the housing parts that forms a flat contact wall; and
    contact areas for connecting the housing to an interconnect device, the contact areas being arranged at the contact wall, wherein a first one of the housing parts comprises a material of a first plastic and a second one of the housing parts comprises a material of a second plastic that is different than the first plastic, the first plastic being doped with palladium.

2. The housing according to claim 1, further comprising coupling regions for coupling the electronic component to the housing, wherein the coupling regions are electrically connected to the contact areas.

3. The housing according to claim 1, wherein the first and/or the second plastic comprises a liquid crystalline polymer.

4. The housing according to claim 1, wherein the contact areas comprise a layer of an electrically conductive material that is mechanically coupled to one of the housing parts.

5. The housing according to claim 4, wherein the layer comprises an electroplated material.

6. The housing according to claim 1, wherein the housing comprises a cuboid housing.

7. The housing according to claim 1, wherein the housing includes a recess and a closure element that is arranged in the recess, the closure element closing off the recess and producing a closed cavity in the housing.

8. The housing according to claim 7, wherein the closure element attaches the electronic component that is normally arranged in the recess to the housing in a mechanically rigid manner.

9. The housing according to claim 7, wherein the closure element is manufactured by means of casting.

10. The housing according to claim 1, wherein the housing comprises an opposing wall that lies opposite the contact wall and forms a closed, flat outer surface.

11. The housing according to claim 10, wherein the housing features side walls that are arranged between the contact wall and the opposing wall, wherein one of the side walls features an opening.

12. An electronic device comprising:
    a housing formed from a plurality of housing parts that are mechanically coupled together, an outer wall of the housing forming a contact wall with contact areas; and
    an electronic component disposed within a recess of the housing, the electronic component being electrically coupled to the contact areas, wherein a first one of the housing parts comprises a material of a first plastic and a second one of the housing parts comprises a material of a second plastic that is different than the first plastic, the first plastic being doped with palladium.

13. The electronic device according to claim 12, wherein the electronic component comprises an inductive component.

14. The electronic device according to claim 12, wherein the housing is a cuboid housing.

15. The electronic device according to claim 12, wherein the housing further comprises a closure element to close off the recess and to produce a closed cavity in which the electronic component is disposed.

16. The electronic device according to claim 15, wherein the closure element attaches the electronic component to the housing in a mechanically rigid manner.

17. An electronic device comprising:
    a housing comprising a cavity formed from a first wall, a second wall, a third wall, and a fourth wall that surround sides of the cavity and a fifth wall that encloses a bottom of the cavity;
    the housing formed from a plurality of housing parts, first ones of the housing parts comprising conductive housing parts and second ones of the housing parts comprising non-conductive housing parts;
    the first wall comprising a plurality of contact areas, each contact area being formed from a conductive housing part; and
    a plurality of coupling regions formed within the second and/or third walls, each coupling region being electrically coupled to a respective contact area via at least one conductive housing part, wherein a first one of the housing parts comprises a material of a first plastic and a second one of the housing parts comprises a material of a second plastic that is different than the first plastic, the first plastic being doped with palladium.

18. The electronic device according to claim 17, further comprising:
    an electronic component disposed within the cavity and electrically coupled to the coupling regions; and
    a closure element to close the cavity, the closure element mechanically securing the electronic component within the cavity.

* * * * *